United States Patent
Goodman et al.

(10) Patent No.: US 11,594,444 B2
(45) Date of Patent: Feb. 28, 2023

(54) SUSCEPTOR WITH SIDEWALL HUMPS FOR UNIFORM DEPOSITION

(71) Applicant: ASM IP HOLDING B.V., Almere (NL)

(72) Inventors: Matthew Goodman, Chandler, AZ (US); Thomas John Kirschenheiter, Tempe, AZ (US); Kevin Eugene Quinn, Gilbert, AZ (US)

(73) Assignee: ASM IP Holding, B.V., Almere (NL)

( * ) Notice: Subject to any disclaimer, the term of this patent is extended or adjusted under 35 U.S.C. 154(b) by 86 days.

(21) Appl. No.: 17/141,610

(22) Filed: Jan. 5, 2021

(65) Prior Publication Data

US 2021/0225688 A1 Jul. 22, 2021

Related U.S. Application Data

(60) Provisional application No. 62/963,847, filed on Jan. 21, 2020.

(51) Int. Cl.
| | | |
|---|---|---|
| *C30B 25/10* | (2006.01) | |
| *H01L 21/687* | (2006.01) | |
| *H01L 21/02* | (2006.01) | |
| *C23C 16/458* | (2006.01) | |
| *C30B 25/12* | (2006.01) | |
| *C30B 29/06* | (2006.01) | |
| *C23C 16/24* | (2006.01) | |
| *H01L 21/67* | (2006.01) | |

(52) U.S. Cl.
CPC ........ *H01L 21/68735* (2013.01); *C23C 16/24* (2013.01); *C23C 16/4585* (2013.01); *C30B 25/12* (2013.01); *C30B 29/06* (2013.01); *H01L 21/0262* (2013.01); *H01L 21/02532* (2013.01); *H01L 21/67115* (2013.01)

(58) Field of Classification Search
CPC ..... C30B 25/10; C30B 29/06; C23C 16/4585; H01L 21/68735; H01L 21/02532; H01L 21/0262; H01L 21/67115
See application file for complete search history.

(56) References Cited

U.S. PATENT DOCUMENTS

| | | |
|---|---|---|
| 5,583,736 A | 12/1996 | Anderson et al. |
| 6,077,357 A | 6/2000 | Rossman et al. |
| 6,086,680 A | 7/2000 | Foster et al. |
| 6,634,882 B2 | 10/2003 | Goodman |
| 6,709,267 B1 | 3/2004 | Hawkins et al. |
| 6,776,849 B2 | 8/2004 | Aggarwal et al. |

(Continued)

FOREIGN PATENT DOCUMENTS

WO    WO 2010-016964    2/2010

*Primary Examiner* — Robert M Kunemund
(74) *Attorney, Agent, or Firm* — Banner & Witcoff, Ltd.

(57) ABSTRACT

The present disclosure relates to a susceptor having a generally circular body having a face with a radially inward section and a radially outward section which includes a substrate supporting surface elevated relative to the radially inward section. A sidewall surrounds the substrate supporting surface which upon retention of a substrate on the radially outward section, the sidewall surrounds the substrate. The sidewall includes a plurality of humps which protrude from the top surface of the sidewall. Advantageously, the plurality of humps may aid in even thickness of deposition of material at the edge of the substrate.

14 Claims, 8 Drawing Sheets

(56) References Cited

U.S. PATENT DOCUMENTS

| | | | |
|---|---|---|---|
| 7,033,445 B2 | 4/2006 | Keeton et al. | |
| 7,070,660 B2 | 7/2006 | Keeton et al. | |
| 7,601,224 B2 | 10/2009 | Foree | |
| 7,648,579 B2 | 1/2010 | Goodman et al. | |
| 9,824,893 B1* | 11/2017 | Smith | H01L 21/02175 |
| 10,381,219 B1* | 8/2019 | Ueda | H01L 21/0217 |
| 2002/0023590 A1 | 2/2002 | Storbeck | |
| 2004/0060512 A1 | 4/2004 | Waldhauer et al. | |
| 2005/0092439 A1 | 5/2005 | Keeton et al. | |
| 2005/0207089 A1 | 9/2005 | Ito | |
| 2005/0284372 A1 | 12/2005 | Murugesh et al. | |
| 2007/0269294 A1 | 11/2007 | Nagasaka et al. | |
| 2009/0280248 A1 | 11/2009 | Goodman et al. | |
| 2010/0013169 A1 | 1/2010 | Monteen et al. | |
| 2010/0107974 A1 | 5/2010 | Givens et al. | |
| 2013/0109192 A1 | 5/2013 | Hawkins et al. | |
| 2014/0141619 A1* | 5/2014 | Sawada | H01J 1/46 |
| | | | 438/711 |
| 2016/0078245 A1 | 3/2016 | Amarendran et al. | |
| 2018/0114715 A1* | 4/2018 | Iyechika | C30B 25/10 |
| 2018/0329951 A1 | 11/2018 | Yu et al. | |

* cited by examiner

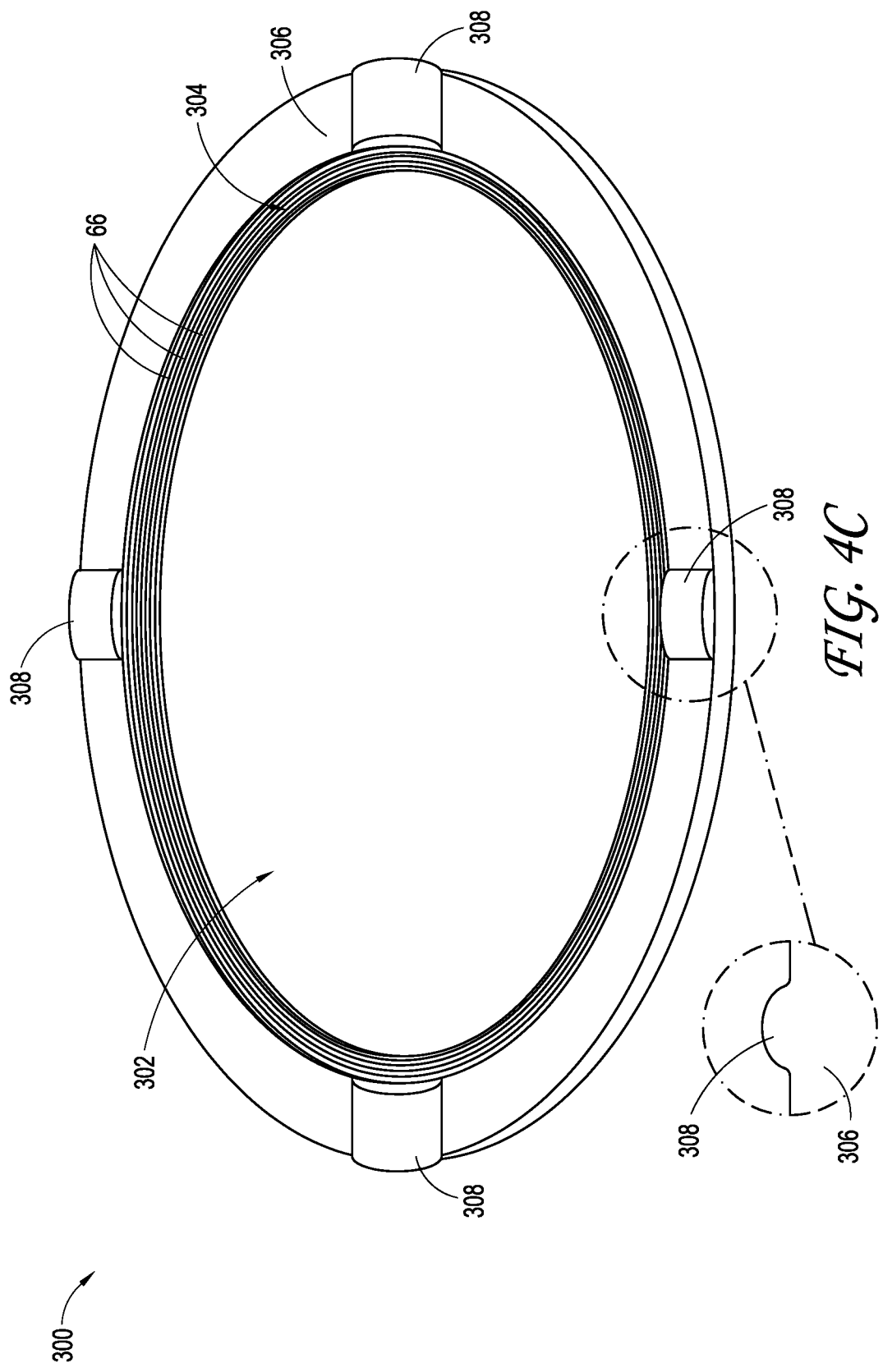

SUSCEPTOR WITH SIDEWALL HUMPS FOR UNIFORM DEPOSITION

CROSS REFERENCE TO PRIORITY APPLICATIONS

Any and all applications for which a foreign or domestic priority claim is identified in the Application Data Sheet as filed with the present application are hereby incorporated by reference under 37 CFR 1.57. This application claims the benefit of priority to U.S. Provisional Patent Application No. 62/963,847, filed Jan. 21, 2020 and entitled "SUSCEPTOR WITH SIDEWALL HUMPS FOR UNIFORM DEPOSITION," which is hereby incorporated by reference in its entirety herein.

FIELD OF THE INVENTION

This disclosure relates generally to semiconductor processing, and more particularly to susceptors for supporting semiconductor substrates in process chambers.

BACKGROUND

Semiconductor fabrication processes are typically conducted with semiconductor substrates supported within a chamber under controlled conditions. To conduct various processes, the substrates (e.g., wafers) are heated inside the process chamber. For example, substrates may be heated by direct physical contact with an internally heated wafer holder or "chuck."

As another example, substrates may be heated by radiant heat (e.g., from heat lamps) and may be supported on "susceptors", with both the substrate and underlying susceptor absorbing the radiant heat. Susceptors are commonly formed by machining graphite into a desired shape and applying a silicon carbide (SiC) Coating. The susceptors may be formed in different shapes, but many are generally circular.

During process, the heated substrates may be exposed to chemical species (e.g., gases flowed into the process chamber), which may deposit and/or react with materials on the substrate. In some other processes, the heating of the substrate may itself be utilized to cause changes in the substrate. The deposited materials, reacted materials, and/or changed substrate may be understood to constitute examples of the results of various processes conducted on the substrate. It will be appreciated that uniformity in process results across a substrate and between different processed substrates is desirable for, among other things, the reliability and yield of electronic devices formed on or in the substrates. As the complexity of devices increases and/or as the sizes of devices decrease, the requirements for uniform process results become increasingly more stringent. As a result, there is a continuing need for apparatuses and methods that provide uniform process results.

SUMMARY

In an aspect, a susceptor for supporting a substrate during semiconductor processing is provided, the susceptor including: a generally circular body having a face including: a radially inward section; a radially outward section having a substrate supporting surface elevated relative to the radially inward section; a sidewall surrounding the substrate supporting surface and configured to surround the substrate upon retention of the substrate on the radially outward section, where the sidewall comprises a plurality of humps protruding from a top surface of the sidewall.

In some embodiments, the plurality of humps includes a first hump and a second hump located 90° relative to one another along the sidewall. The plurality of humps may further include a third hump which is located at 90° relative to one of the first and second humps along sidewall. Further, the plurality of humps may further include a fourth hump which is located at 90° relative to one of the other humps of the plurality of humps.

In some embodiments the plurality of humps have a general shape of a mound with cut-off sides, where the cut-off sides are coextensive with inner and outer sides of the sidewall. The plurality of humps may each have opposing sides each gradually increasing in height to a maximum height.

In another aspect, a method of processing a crystalline substrate is provided, the method including: providing the crystalline substrate on a susceptor in a semiconductor process chamber, the susceptor having a sidewall extending around a perimeter of the substrate, the sidewall having a plurality of humps; and heating the crystalline substrate on a susceptor.

In some embodiments, the method may further include determining a first crystallographic plane of the crystalline substrate and aligning the plurality of humps with the first crystallographic plane, where aligning the plurality of humps causes one of the plurality of humps to align with the first crystallographic plane of the crystalline substrate. The plurality of humps may include a first hump and a second hump, and aligning the plurality of humps may cause the first hump to align with the first crystallographic and the second hump to align with a second crystallographic plane of the crystalline substrate.

In some embodiments, the humps extend higher than the substrate. In some embodiments, the method may further include depositing a substantially uniform thickness layer onto the crystalline substrate. The uniform thickness layer may include doped or undoped single crystalline silicon.

In some embodiments, the plurality of humps includes a first hump and a second hump located about 90° relative to one another along the sidewall. Further, the plurality of humps may further include a third hump which is located about 90° relative to one of the first and second humps along sidewall. Also, the plurality of humps may further include a fourth hump which is located about 90° relative to one of the other humps of the plurality of humps.

Additional examples of embodiments are enumerated below.

Example 1. A susceptor for supporting a substrate during semiconductor processing, the susceptor comprising:
a generally circular body having a face comprising:
 a radially inward section;
 a radially outward section having a substrate supporting surface elevated relative to the radially inward section;
 a sidewall surrounding the substrate supporting surface and configured to surround the substrate upon retention of the substrate on the radially outward section,
 wherein the sidewall comprises a plurality of humps protruding from a top surface of the sidewall.

Example 2. The susceptor of Example 1, wherein the plurality of humps comprises a first hump and a second hump located 90° relative to one another along the sidewall.

Example 3. The susceptor of Example 2, wherein the plurality of humps further comprises a third hump which is located at 90° relative to one of the first and second humps along sidewall.

Example 4. The susceptor of Example 3, wherein the plurality of humps further comprises a fourth hump which is located at 90° relative to one of the other humps of the plurality of humps.

Example 5. The susceptor of Example 1, wherein the plurality of humps have a general shape of a mound with cut-off sides, wherein the cut-off sides are coextensive with inner and outer sides of the sidewall.

Example 6. The susceptor of Example 1, wherein the plurality of humps each have opposing sides each gradually increasing in height to a maximum height.

Example 7. A method of processing a crystalline substrate, the method comprising:
providing the crystalline substrate on a susceptor in a semiconductor process chamber, the susceptor having a sidewall extending around a perimeter of the substrate, the sidewall having a plurality of humps; and
heating the crystalline substrate on a susceptor.

Example 8. The method of Example 7, further comprising:
determining a first crystallographic plane of the crystalline substrate; and
aligning the plurality of humps with the first crystallographic plane, wherein aligning the plurality of humps causes one of the plurality of humps to align with the first crystallographic plane of the crystalline substrate.

Example 9. The method of Example 8, wherein the plurality of humps comprises a first hump and a second hump, and wherein aligning the plurality of humps causes the first hump to align with the first crystallographic and the second hump to align with a second crystallographic plane of the crystalline substrate.

Example 10. The method of Example 7, wherein the humps extend higher than the substrate.

Example 11. The method of Example 7, further comprising depositing a substantially uniform thickness layer onto the crystalline substrate.

Example 12. The method of Example 11, wherein the uniform thickness layer comprises doped or undoped single crystalline silicon.

Example 13. The method of Example 7, wherein the plurality of humps comprises a first hump and a second hump located about 90° relative to one another along the sidewall.

Example 14. The method of Example 13, wherein the plurality of humps further comprises a third hump which is located about 90° relative to one of the first and second humps along sidewall.

Example 15. The method of Example 14, wherein the plurality of humps further comprises a fourth hump which is located about 90° relative to one of the other humps of the plurality of humps.

BRIEF DESCRIPTION OF THE DRAWINGS

FIG. 4C is a perspective view of a susceptor according to some embodiments.

DETAILED DESCRIPTION

Figure 1:
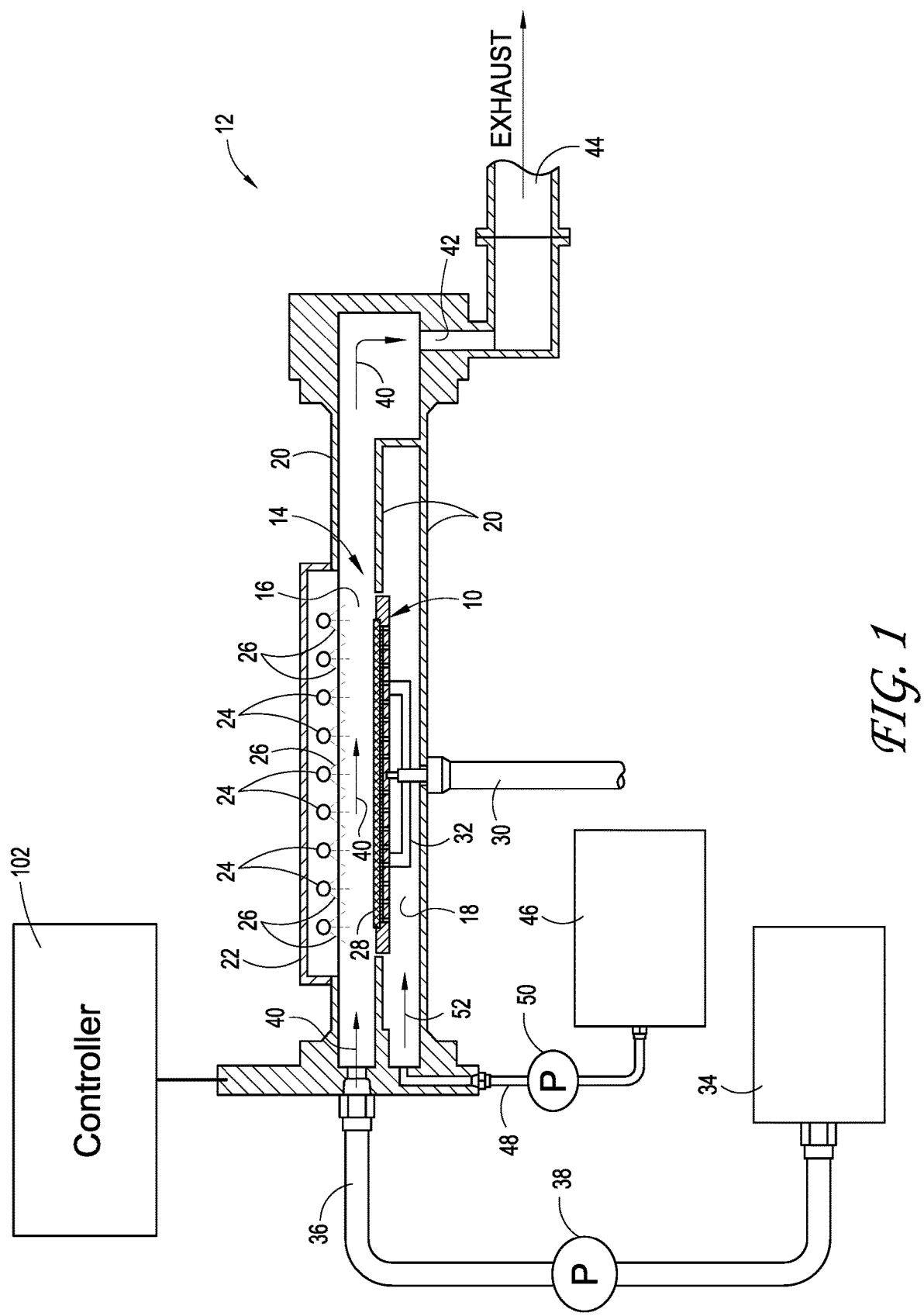
FIG. 1 schematically shows a cross-section of a semiconductor processing system according to some embodiments.

It has been found that the deposition of layers of material on a crystalline substrate may leave nonuniformities that repeat periodically around a substrate. These nonuniformities may be particularly pronounced after the epitaxial growth of material on the crystalline substrate, such as the epitaxial growth of silicon on a polycrystalline silicon substrate. During such depositions, there may be areas of excessive thickness which repeat, e.g., in regular intervals around the periphery of a round substrate.

For example, these non-uniformities may be especially problematic for epitaxial-silicon depositions at 1000° C. to 1200° C., including 1050° C. to 1200° C., to deposit epitaxial silicon layers of 2 μm to 100 μm. At these thicknesses, when photoresist is deposited over the silicon, the non-uniformities may be propagated to the photoresist layer, which may cause imprecision when lithographically defining patterns in the photoresist.

It has generally been thought that temperature nonuniformity across a substrate will cause nonuniform deposition results. However, providing exceptionally uniform temperatures around the substrate has not been found to be effective in reducing the above-mentioned period excessive growth of material.

Without being limited by theory, it is believed that the excessive growth is the result of preferential growth along the crystallographic planes of the crystalline substrate. For example, for a {100} orientation silicon substrate, the crystallographic planes are perpendicular to each other and will occur every 90° along the edge of the substrate. Notably, the excessive epitaxial growth of silicon on a {100} orientation silicon substrate has been found to occur every 90° along the edge of the silicon substrate.

In some embodiments, a substrate may be processed while supported on a susceptor having a sidewall that surrounds the outer edge of the substrate. The sidewalls may have humps or protrusions, which preferably extend upwards. The locations of these humps occur at positions coinciding with the expected positions of areas of excessive epitaxial growth on the substrate. For example, for use in processing {100} orientation silicon substrates, the humps preferably occur every 90° along the susceptor sidewall.

In some embodiments, processing a crystalline substrate involves determining the orientations of the crystallographic planes of the substrate. Subsequently, the crystalline substrate and the sidewall humps are positioned relative to one another such that the crystallographic planes and the humps are aligned. In some embodiments, epitaxial silicon is deposited on the substrate at temperatures of 700° C. to 1200° C., including 1000° C. to 1200° C. and 1050° C. to 1200° C., to a thickness of e.g. 2 μm to 100 μm. In some embodiments, photoresist is deposited over the epitaxial silicon and is subsequently photolithographically patterned.

Advantageously, the presence of the susceptor humps and their alignment with the crystallographic planes of the substrate reduces the excessive growth of deposit materials coinciding with the crystallographic planes. In addition, the humps provide a simple mechanism for modulating the excessive growth. For example, the amount of reduction in the growth of deposited material may be advantageously controlled by appropriate selection of the size of the humps. Thus, uniformity in process results may be improved by the use of susceptors with humps as disclosed herein. For example, photolithographically-defined patterns may be formed with high precision over epitaxial silicon grown on the substrates.

Reference will now be made to the figures, in which like reference numerals refer to like parts throughout.

FIG. 1 illustrates a susceptor 10 positioned within a semiconductor processing system 12 having a reaction chamber (or processing chamber) 14 with an upper chamber 16 and a lower chamber 18. Reaction chamber 14 includes walls 20 forming at least a portion of the outer perimeter of each chamber and may be composed of any suitable material, including but not limited to quartz. A heating element housing 22 may be formed in upper chamber 16 above susceptor 10 to secure radiant heating elements 24 to produce heat 26 directed at susceptor 10 and a substrate 28. The substrate 28 may be but is not limited to a semiconductor wafer, a glass substrate, or a plastic substrate. As discussed herein, some embodiments may be particularly advantageously applied to processing semiconductor wafers that are crystalline silicon wafers.

Susceptor 10 may be secured directly to an elevator 30 through susceptor mount 32 to permit vertical positioning of the susceptor 10 and the substrate 28 thereon. Further a heating element (not shown) may be located adjacent the susceptor 10.

The upper chamber 16 may be fed a reactant or precursor material 34, with a carrier gas, through gas line 36 by pump 38. Precursor 34 is feed through upper chamber 16 in the direction associated with arrows 40 until reaching exhaust aperture 42 and ultimately exhaust port 44, thereby providing a laminar flow of process gases through the reaction chamber 14, which may thus function as a laminar flow reaction chamber. In some embodiments, precursor material 34 may be a silicon precursor, such as Trichlorosilane (TCS) and the carrier gas may be an inert gas or $H_2$.

In some embodiments, a second precursor source 46 may be hydrogen chloride (HCl) with an $H_2$ carrier or any other suitable precursor with a carrier gas which is pumped through gas line 48 by pump 50. Precursor 46 is then introduced into lower chamber 18 in the direction associated with arrows 52 where it then may escape to the upper chamber through gaps between the susceptor and a graphite ring and between the graphite ring and the quartz chamber, not specifically shown. Precursor 46 may then exit through exhaust aperture 42 and exhaust outlet 44. It will be appreciated that, in some embodiments, mass flow controllers (not shown) may be provided in the gas lines 36 and 38 upstream of the chambers 14 and 18, respectively to regulate gas flow into the chambers 14 and 18.

In some embodiments, the reaction chamber may be a single chamber instead of a split chamber (e.g., may have only the upper chamber 16, omitting the lower chamber 18), or may be a reduced volume chamber, or may have any combination of chamber attributes. Further, precursor 46 may be arranged to include a separate exhaust port if intermingling of the precursors is not desired. In addition, one or more other precursors or process gases may be connected in gas communication with the gas lines 36 or 48, as desired, to provide the additional gas species for processes performed in the chamber 16.

The process system 12 may be controlled by a controller 102. The controller may control various functional aspects of the process system 12 including but not limited to the heating elements 24, the elevator 30, the exhaust aperture, the pumps 38, 50, mass flow controllers, etc. In some embodiments, the controller 102 may include one or more processors in communication with a computer readable medium having computer readable code with instructions for controlling operation of the process system 12. The computer readable medium may be any data storage device that stores data in non-transitory, tangible form, including read-only memory, random-access memory, CD-ROMs, HDDs, DVDs, magnetic tape, and optical data storage devices. In some embodiments, the computer readable medium may be distributed over network-coupled computer systems so that the computer readable code is stored and executed in a distributed fashion. Any of the processes and methods described herein may be embodied in computer readable code which may be executed by one or more hardware computer processors of the controller 102. In some embodiments, particular operations and methods may be performed by circuitry that is specific to a given function, such that the code may be understood to be part of the circuitry.

Figure 2A:
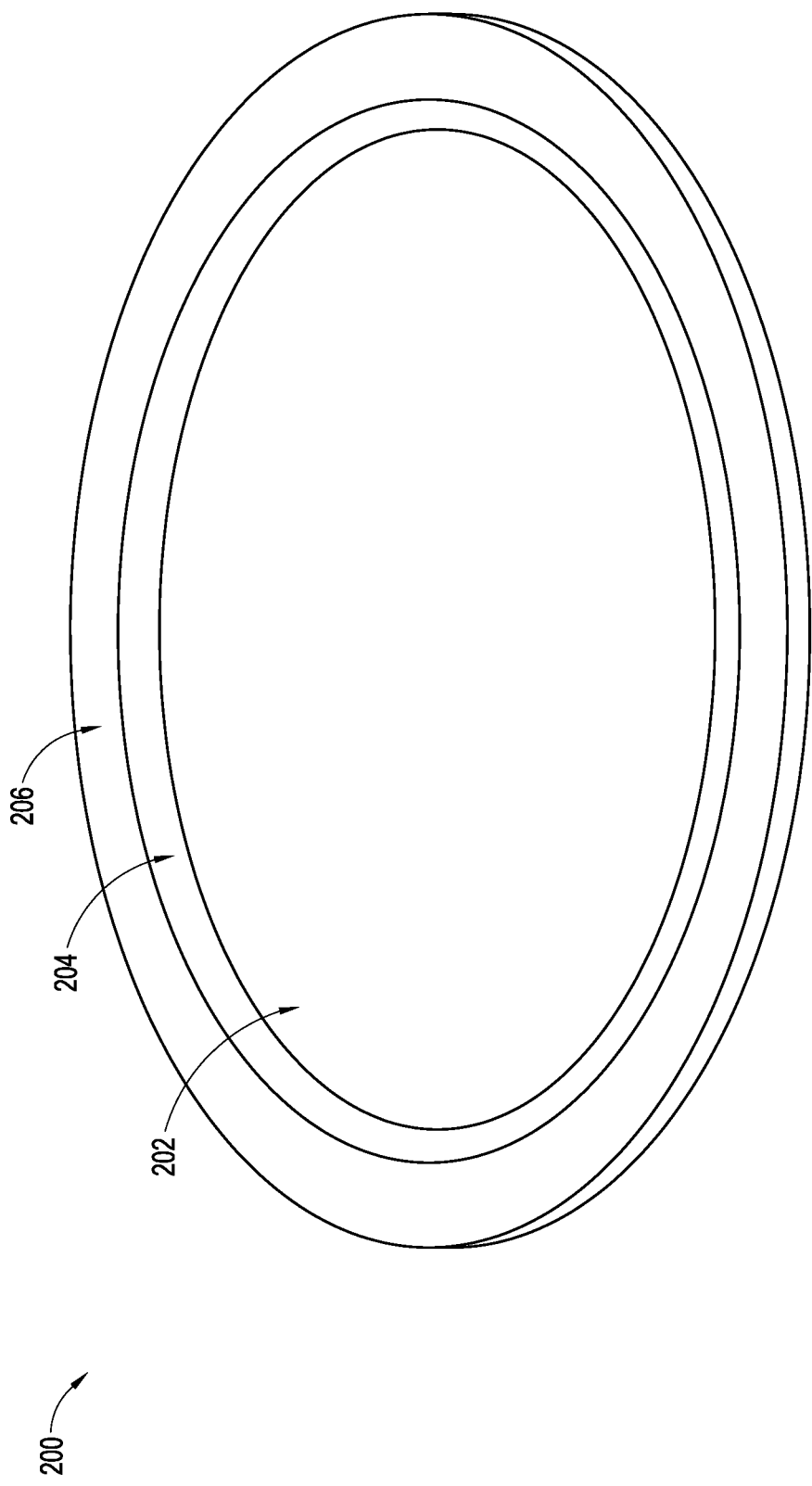
FIG. 2A is a perspective view of a susceptor.

With reference now to FIG. 2A, a perspective view is illustrated of an example of a susceptor 200 which includes a generally circular body. The generally circular body includes a radially inward section 202 and a radially outward section 204, which includes a substrate supporting surface which is elevated relative to the radially inward section. The substrate supporting surface is capable of supporting a substrate. The generally circular body further includes a sidewall 206 that surrounds the substrate supporting surface. When a substrate is retained upon the substrate supporting surface, the sidewall surrounds the substrate. The sidewall 206 is directly connected to and surrounds the radially outward section 204.

Figure 2B:
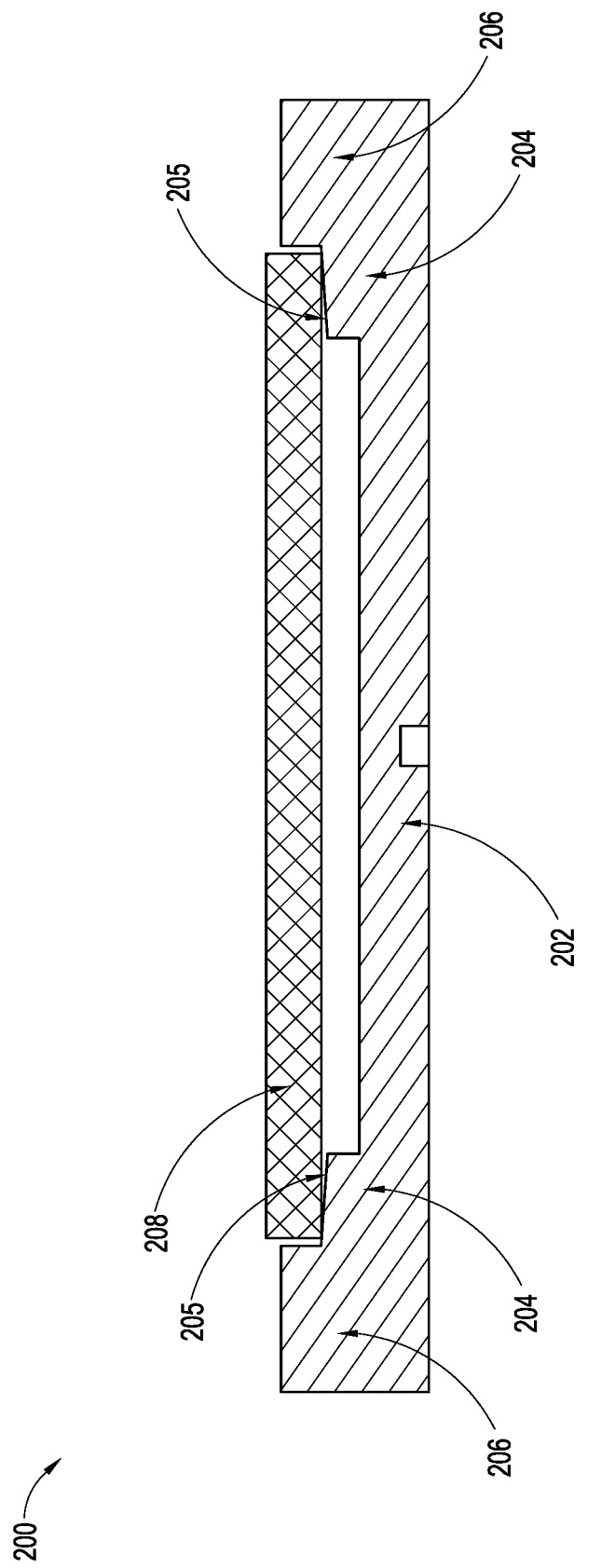
FIG. 2B is a cross-sectional sideview of the susceptor depicted in FIG. 2A.

FIG. 2B illustrates a cross-sectional view of the susceptor 200 of FIG. 2A. A substrate 208 is supported by the substrate support surface 205 of the radially outward section 204. The susceptor 200 is designed to keep the substrate 208 at an even temperature across the entire substrate during a deposition.

Figure 3:
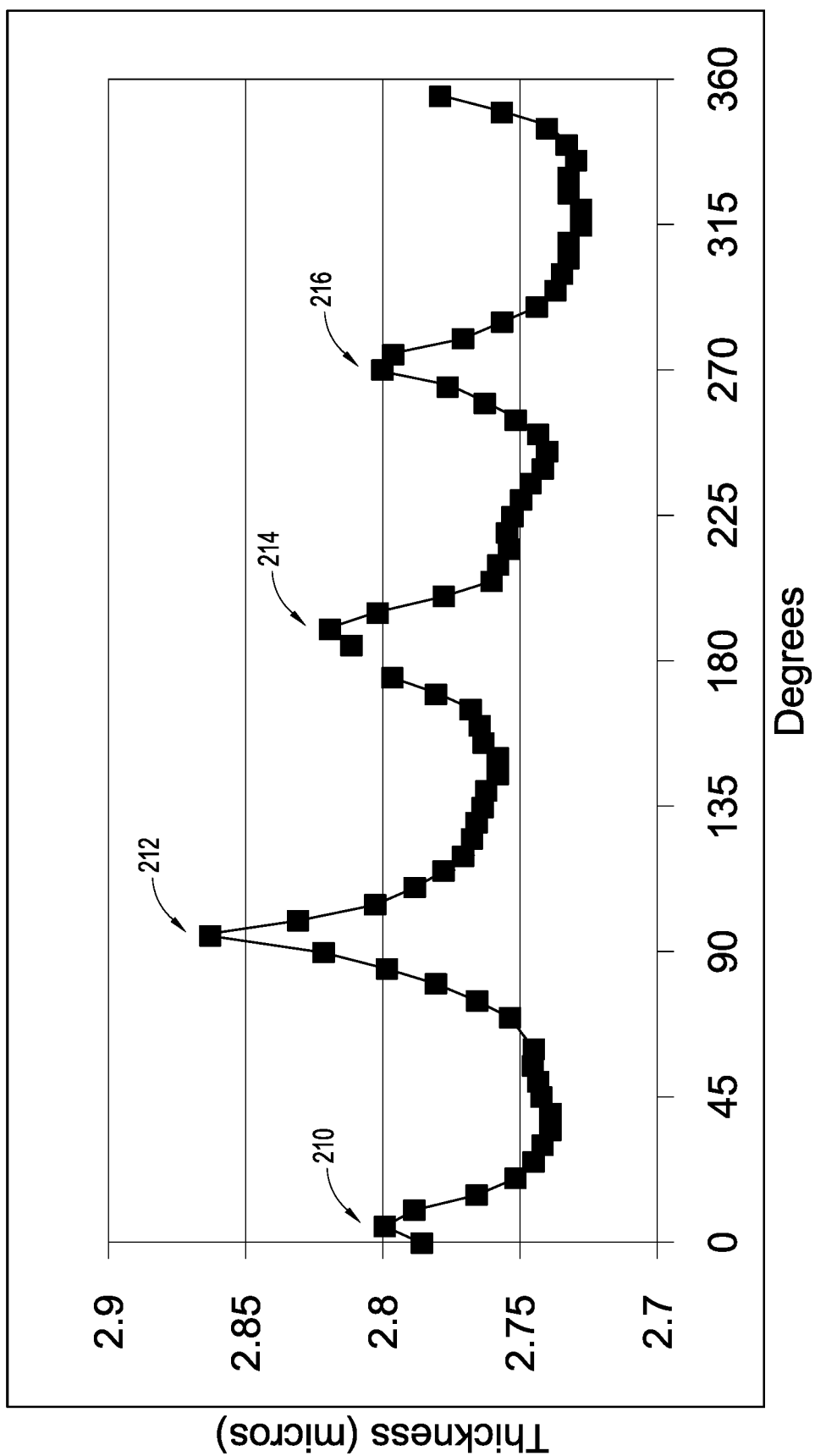
FIG. 3 is a graph depicting thickness of a deposited layer on a crystalline substrate using the susceptor depicted in FIG. 2A.

With reference now to FIG. 3, a plot is illustrated depicting thickness of the deposition of a layer of epitaxial silicon. The thickness is measured at the edge portion of the substrate 208 after a deposition using the susceptor 200 illustrated in FIGS. 2A and 2B. The thickness is measured around the edge of the substrate with the horizontal axis labelled "Degrees" illustrating a location around the substrate (with the entirety of the round substrate spanning 360°) and the vertical axis labelled "thickness" illustrating the thickness of the deposited layer in microns. This deposition occurred on a {100} orientation silicon wafer. In an {100} orientation silicon wafer, the crystallographic planes are perpendicular to each other and therefore the crystallographic planes will occur every 90° along the edge of the wafer. As seen in FIG. 3, the deposited layer thickness has a series of peaks at the edge of the wafer. The first peak 210 occurs around 2° and the second peak 212 occurs around 92° which is about 90° from the first peak 214. Subsequently, the third peak 216 and fourth peak 218 occur at about 182° and 272°, respectively. Therefore, all the peaks line up with the crystallographic planes of the silicon wafer. While temperature uniformity is understood to provide deposited thickness uniformity, and while the susceptor 200 is designed to keeping the substrate 208 at an even temperature during deposition, uneven deposition at the edge of the substrate 208 nevertheless have been found to occur, with this occurrence corresponding to the crystallographic planes of the substrate 208. The same uneven depositions corresponding to the crystallographic planes at the edge of the substrate may also occur in other crystalline substrates such as a silicon wafer with crystalline orientation other than {100}. It is understood that for a silicon wafer with orientation other than {100}, the crystallographic panes may occur at a different interval than every 90° and the sidewall humps disclosed herein may be in other locations corresponding to locations of excessive deposition on the crystalline substrate.

It is understood that this uneven deposition would occur on other crystalline substrates, including any other {100} orientation single crystal diamond cubic crystal structure substrate. The substrate may be doped or undoped in some embodiments.

Figure 4A:
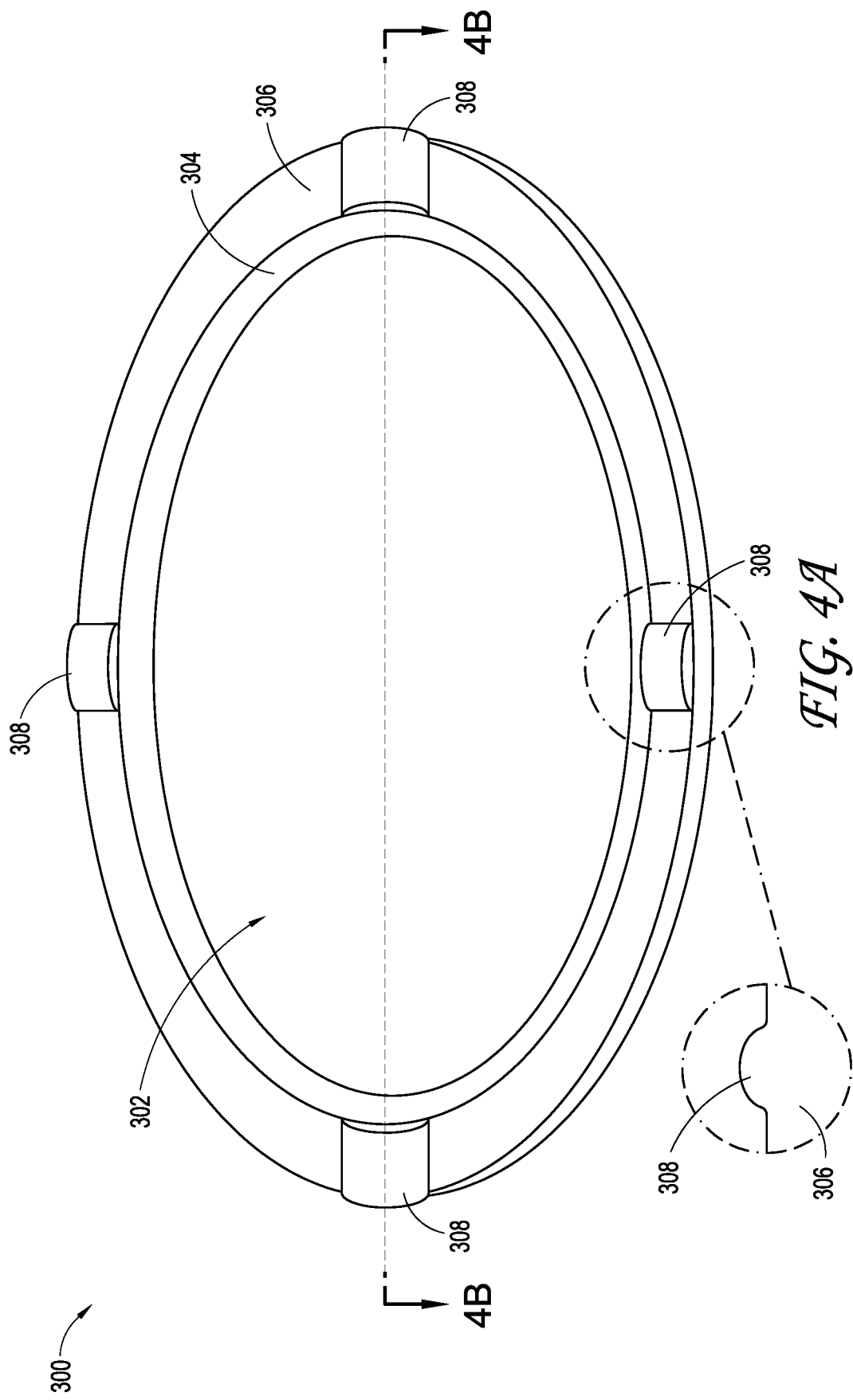
FIG. 4A is a perspective view of a susceptor according to some embodiments.

With reference now to FIG. 4A, a perspective view is illustrated of an example of an embodiment of a susceptor 300 with a plurality of humps 308 present on a sidewall 306. The humps 308 may be protrusions or upwardly extending masses of material. The susceptor 300 includes a circular body and has a radially inward section 302 and a radially outward section 304. The radially inward section 302 may be slanted, curved or flat. The radially outward section 304 includes a substrate supporting surface which is elevated relative to the radially inward section. The substrate supporting surface is configured to support a substrate. The substrate supporting surface may be slanted in order to contact the edge of a substrate. The generally circular body further includes the sidewall 306 that surrounds the substrate supporting surface of the radially outward section 304. When a substrate is retained upon the substrate supporting surface, the sidewall surrounds (encircles) the substrate. The sidewall 306 is directly connected to and surrounds the radially outward section 304.

The sidewall 306 further includes the plurality of humps 308. Without being limited by theory, it is believed that the plurality of humps 308 modulate heating of adjacent sections of the substrate, with the substrate having been positioned such that crystallographic planes are aligned with individual ones of the humps 308. The nonuniformity in heating is believed to compensate for the preferential deposition of material along crystallographic planes along the edges of the substrate, as depicted in FIG. 3.

In some embodiments, each of the plurality of humps 308 are spaced apart by 90° relative to one another along the sidewall 306 (that is, at the 0°, 90°, 180°, and 270° positions along the sidewall 306. Such embodiments may advantageously be used to support a crystalline substrate such as a {100} orientation silicon wafer during processing. Alternatively, the crystalline substrate may be any {100} single crystal diamond cubic crystal structure wafer or substrate. Each of the plurality of humps 308 are spaced such that they may be aligned with a crystallographic plane of the crystalline substrate. In such embodiments, there are four humps which would each align with a crystallographic plane of a supported crystalline substrate.

In some embodiments, the plurality of humps 308 have a shape of a mound with cut-off sides or a portion of a cylinder. The cut-off sides may be coextensive with inner and outer sides of the sidewall 306 (the inner side of the sidewall 306 being the side of the sidewall 306 facing the radially inward section 302, and outer side of the sidewall 306 being the side of the sidewall 306 facing away from the radially inward section 302). In some embodiments, the height of a hump 308 may taper towards the inner and/or outer sides of the sidewall 306. In some embodiments, the top of the sidewall 306 may be flat except for the humps 308. In some embodiments, the plurality of humps may each gradually increase in height from a flat portion of the sidewall 306 to a maximum height. In some embodiments, the increase in height may follow the profile of a semi-circle. In some embodiments, the increase in height may follow the profile of a S-curve. The size and shape of the hump may be selected to provide a substantially uniform deposition thickness for deposited layers along the circumference of a substrate processed while supported by the susceptor 300. The substantially uniform deposition thickness is more uniform than that obtained with an otherwise identical deposition performed using an otherwise identical susceptor that does not contain humps 308. In some embodiments, where the sidewall 306 is understood to extend 360°, the humps may each have a width along the sidewall 306 that covers a span of 10°-60° (that is, each of the humps may extend across 1/36 to 1/6 of the length of the circumference of the sidewall 306). In some other embodiments, the humps 308 may span 10°-50°, 10°-40°, 10°-30°, 10°-20°, 20°-50°, 20°-40°, or 20°-30° of the circumference of the sidewall 306. In some embodiments, the shapes and physical dimensions of each of humps 308 are similar. In some embodiments, one of the humps may extend to a greater height than other humps to, e.g., address higher levels of deposition associated with one substrate position (e.g., the peak 212 of FIG. 3).

Figure 4B:
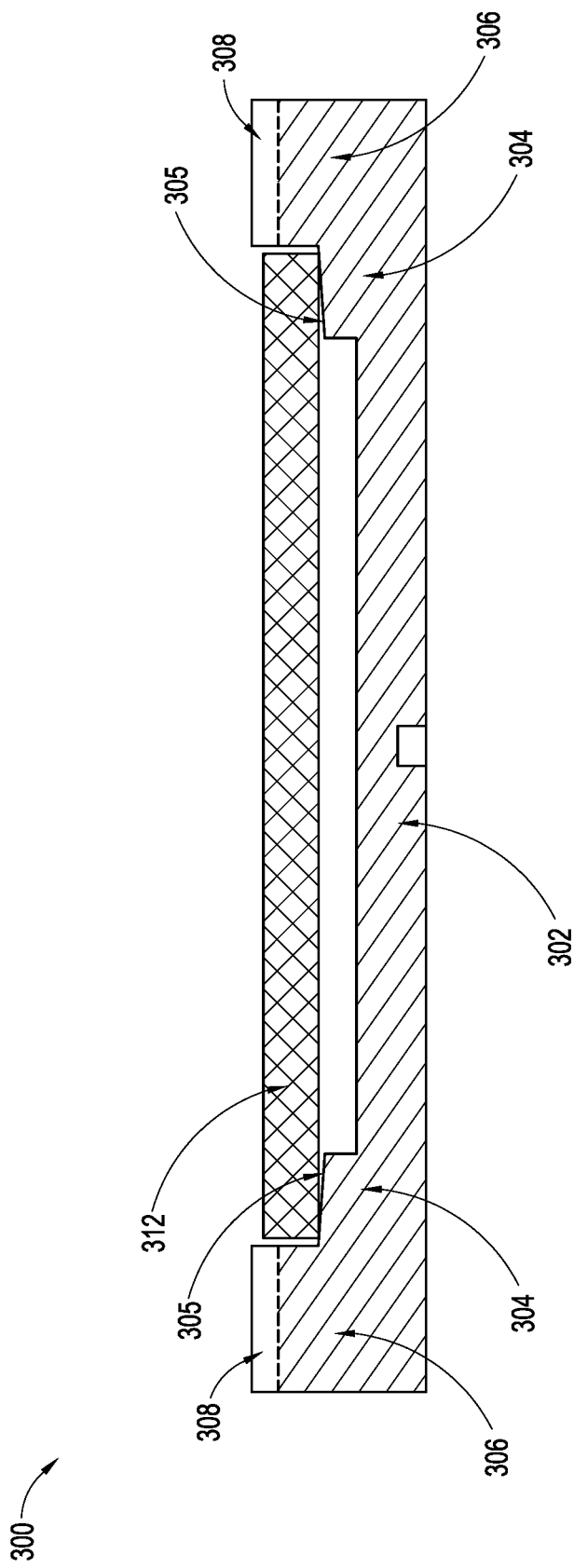
FIG. 4B is a cross-sectional sideview of the susceptor depicted in FIG. 4A.

FIG. 4B illustrates a cross-sectional sideview of the susceptor 300 of FIG. 4A across the line 4B-4B illustrated in FIG. 4A. FIG. 4B shares all elements of FIG. 4A and therefore description of many of these elements will not be repeated. FIG. 4B further shows a substrate 312 that is supported by the substrate support surface 305 of the radially outward section 304. The substrate 312 contacts the substrate support surface 305 at a slant. The substrate supporting surface 305 may tilt at an angle from approximately zero to approximately ten degrees, e.g., approximately three degrees in some embodiments. Alternatively, the substrate supporting surface 305 may be level with the substrate 312 where the side of the substrate 312 lays level on the substrate support surface 305. The susceptor 300 is designed to keep the substrate 312 at a constant temperature across the substrate 312 during the deposition. However, as described, the plurality of humps 308 provide uneven heating at the edge portion of the substrate 312 during deposition to compensate for uneven deposition thicknesses at certain portions of the substrate. The height of the sidewall 306 at a section without the plurality of humps 308 is shown by the dotted line. FIG. 4B illustrates a cross-sectional sideview taken along a plane extending through the susceptor 300 at the maximum heights of two humps of the plurality of humps 308. In some embodiments, maximum height of the plurality of humps 308 is higher than the height of the substrate 312. In some other embodiments, the maximum height of the plurality of humps may also be below the height of the substrate 312. As discussed herein, the substrate may be a crystalline substrate such as a crystalline silicon wafer. The substrate may also be other crystalline substrates or a substrate where uneven deposition at different edge portions occurs.

With reference now to FIG. 4C, a perspective view is illustrated of another example of a susceptor 400 according some embodiments. The susceptor 400 shares features with susceptor 300 of FIG. 4A and description of various ones of the overlapping elements with like numerals will not be repeated. With continued reference to FIG. 4C, in susceptor 400, the radially outward section 304 further includes at least one ring 66 extending upwards from the face of the substrate supporting surface. The at least one ring 66 may include, e.g., anywhere from one to ten concentric rings extending upwards from the substrate supporting surface. In one aspect, the rings 66 are spaced apart at a distance from one another by approximately 0.05 to approximately 5 millimeters and preferably approximately 0.5 mm. The rings 66 may be continuously disposed on the substrate supporting surface and may include a constant radius for consistent substrate locating. As in susceptor 300, the substrate supporting surface of susceptor 400 may also be slanted such that the corner of an edge of the substrate is contacted. The substrate supporting surface may be tilted at an angle from approximately 0° to approximately 10°, and may be approximately 3° in some embodiments. In order to create a slant, the rings 66 may continuously decrease in height such that only the outer most ring contacts the substrate. In operation, rings 66 are useful to help reduce backside deposition on the substrate 312. Rings 66 may be configured to provide a continuous ridge that contacts the backside of the substrate 312 near the circumference of the substrate 312 to prevent process gas from reaching the backside of the substrate 312.

Figure 5:
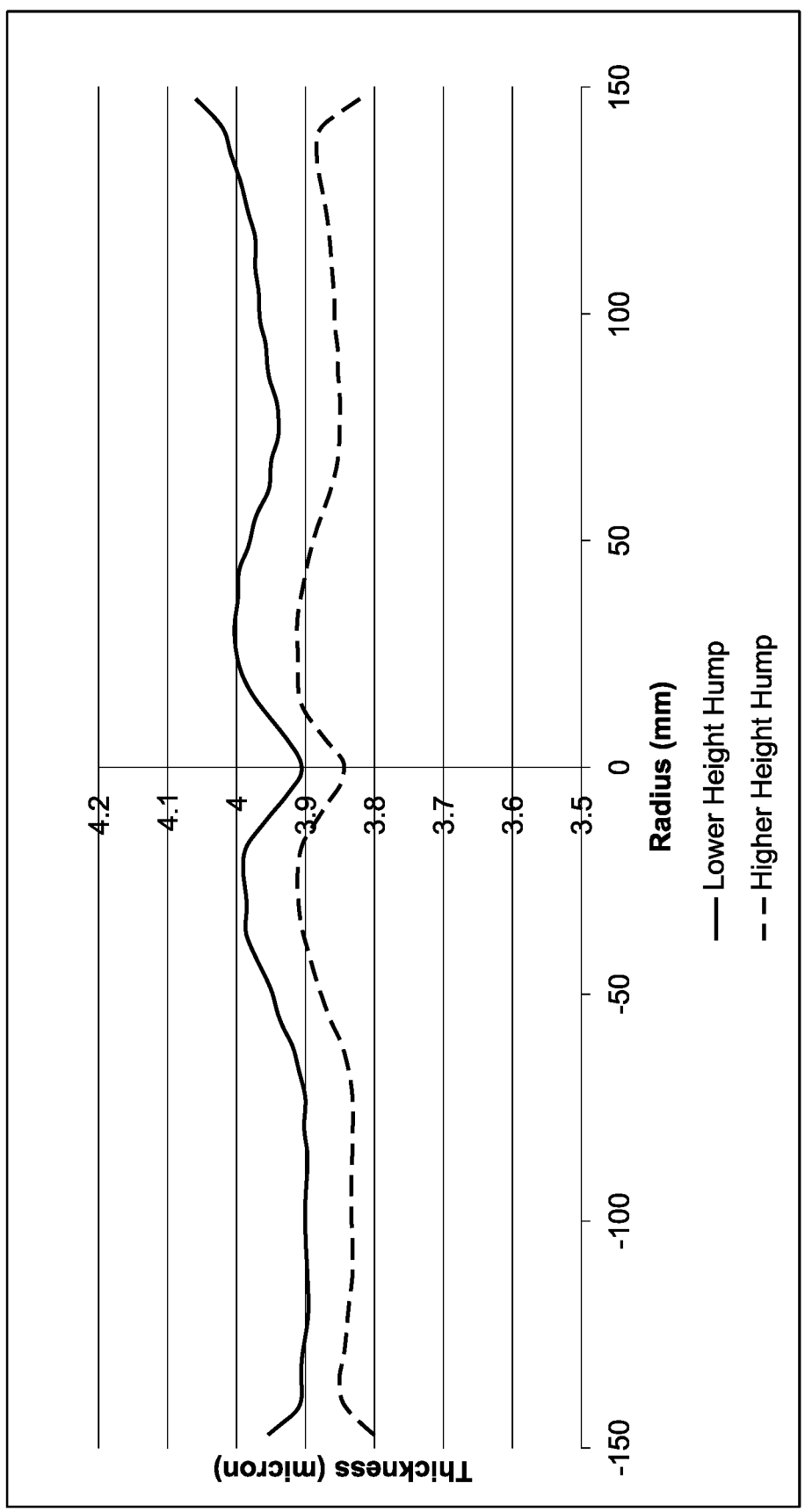
FIG. 5 is a graph depicting thickness of exemplary depositions of deposited layers across a substrate using two susceptors according to some embodiments.

With reference now to FIG. 5, a graph is illustrated depicting thicknesses of deposited layers across substrates processed while supported on two different susceptors. Both susceptors include a plurality of humps similar to the ones illustrated and described in FIGS. 4A-C. However, the plurality of humps in the susceptor used in the deposition illustrated by the plot labeled "Lower Height Hump" has a lower maximum height than the plurality of humps in the susceptor used in the deposition illustrated by the plot labeled "Higher Height Hump." The horizontal axis labelled "Radius" shows position in mm across the wafer. The middle (0 mm) on the horizontal axis illustrates the middle of the wafer whereas to the right of the middle is the right of the wafer and to the left of the middle is the left of the wafer. Thus, for a 300 mm wafer, the edge portions are at the positions −150 mm and 150 mm. The vertical axis labelled "Thickness" illustrates the thickness in microns of an exemplary deposited layer across the wafer. As illustrated, the use of a plurality of humps with a higher maximum height may yield less deposition at parts of the wafer near its edge than the use of humps having a lower maximum height. Thus, it will be understood that the maximum height of the plurality of humps may be selected to provide a desired deposition thickness, e.g., a uniform deposition, at the edge portions of a substrate. It will also be understood that the width of the plurality of humps may be selected to compensate for the width, along the wafer edge, of the non-uniform deposition.

In some embodiments, as described herein, processing a crystalline substrate using a susceptor as described herein may include aligning crystallographic planes of the substrate with the humps of the susceptor. For example, the orientations or positions of the crystallographic planes of the substrate may be determined, and the substrate may be loaded on the susceptor such that the crystallographic planes align with the humps of the susceptor. The substrate and susceptor may then be loaded into a process chamber, in which substrate is heated and exposed to process gases. For example, the substrate may be heated to temperatures of 700° C. to 1200° C., including 1000° C. to 1200° C. and 1050° C. to 1200° C., and precursors for epitaxial growth on the substrate may be flowed into the process chamber. For example, a silicon precursor may be used for deposition of an epitaxial silicon layer on a crystalline silicon wafer. In some embodiments, the deposited layer may have a thickness of 2 μm to 100 μm. The silicon wafer may then be unloaded from the process chamber for further processing. In some embodiments, photoresist may be deposited on the epitaxial silicon layer, and the photoresist may subsequently be patterned by photolithography. Advantageously, the photoresist layer may have high thickness uniformity, which facilitates the formation of a pattern with a high degree of fidelity to a photoreticle pattern.

In the foregoing description, various embodiments been described. It will, however, be evident that various modifications and changes may be made thereto without departing from the broader spirit and scope of the invention. The specification and drawings are, accordingly, to be regarded in an illustrative rather than restrictive sense.

Indeed, it will be appreciated that the systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, one or more example methods or processes may be described herein. However, other operations may be incorporated in the example methods and processes. For example, one or more additional operations may be performed before, after, simultaneously, or between any of the specifically provided operations. Additionally, the operations may be rearranged or reordered in other embodiments. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

Accordingly, the claims are not intended to be limited to the embodiments described herein, but are to be accorded the widest scope consistent with this disclosure, the principles, and the novel features disclosed herein.

What is claimed is:

1. A susceptor for supporting a substrate during semiconductor processing, the susceptor comprising:
   a generally circular body having a face comprising:
      a radially inward section;
      a radially outward section having a substrate supporting surface elevated relative to the radially inward section;
      a sidewall surrounding the substrate supporting surface and configured to surround the substrate upon retention of the substrate on the radially outward section,
   wherein the sidewall comprises a plurality of humps protruding from a top surface of the sidewall.

2. The susceptor of claim 1, wherein the plurality of humps comprises a first hump and a second hump located 90° relative to one another along the sidewall.

3. The susceptor of claim 2, wherein the plurality of humps further comprises a third hump which is located at 90° relative to one of the first and second humps along sidewall.

4. The susceptor of claim 3, wherein the plurality of humps further comprises a fourth hump which is located at 90° relative to one of the other humps of the plurality of humps.

5. The susceptor of claim 1, wherein the plurality of humps have a general shape of a mound with cut-off sides, wherein the cut-off sides are coextensive with inner and outer sides of the sidewall.

6. The susceptor of claim 1, wherein the plurality of humps each have opposing sides each gradually increasing in height to a maximum height.

7. A method of processing a crystalline substrate, the method comprising:
   providing the crystalline substrate on a susceptor in a semiconductor process chamber, the susceptor having a sidewall extending around a perimeter of the substrate, the sidewall having a plurality of humps;
   heating the crystalline substrate on a susceptor;
   determining a first crystallographic plane of the crystalline substrate; and
   aligning the plurality of humps with the first crystallographic plane, wherein aligning the plurality of humps causes one of the plurality of humps to align with the first crystallographic plane of the crystalline substrate.

8. The method of claim 7, wherein the plurality of humps comprises a first hump and a second hump, and wherein aligning the plurality of humps causes the first hump to align with the first crystallographic plane of the crystalline substrate and the second hump to align with a second crystallographic plane of the crystalline substrate.

9. A method of processing a crystalline substrate, the method comprising:
   providing the crystalline substrate on a susceptor in a semiconductor process chamber, the susceptor having a sidewall extending around a perimeter of the substrate, the sidewall having a plurality of humps, wherein the humps extend higher than the substrate; and
   heating the crystalline substrate on a susceptor.

10. A method of processing a crystalline substrate, the method comprising:
    providing the crystalline substrate on a susceptor in a semiconductor process chamber, the susceptor having a sidewall extending around a perimeter of the substrate, the sidewall having a plurality of humps;
    heating the crystalline substrate on a susceptor; and
    depositing a substantially uniform thickness layer onto the crystalline substrate.

11. The method of claim 10, wherein the substantially uniform thickness layer comprises doped or undoped single crystalline silicon.

12. A method of processing a crystalline substrate, the method comprising:
    providing the crystalline substrate on a susceptor in a semiconductor process chamber, the susceptor having a sidewall extending around a perimeter of the substrate, the sidewall having a plurality of humps, wherein the plurality of humps comprises a first hump and a second hump located about 90° relative to one another along the sidewall; and
    heating the crystalline substrate on a susceptor.

13. The method of claim 12, wherein the plurality of humps further comprises a third hump which is located about 90° relative to one of the first and second humps along sidewall.

14. The method of claim 13, wherein the plurality of humps further comprises a fourth hump which is located about 90° relative to one of the other humps of the plurality of humps.

* * * * *